(12) United States Patent
Verd et al.

(10) Patent No.: US 12,469,971 B2
(45) Date of Patent: Nov. 11, 2025

(54) ACTIVE CIRCUIT ANTENNA OPTIMIZATION

(71) Applicant: Naval Information Warfare Center Pacific, San Diego, CA (US)

(72) Inventors: Frederick J. Verd, Santee, CA (US); Justin Church, San Diego, CA (US)

(73) Assignee: United States of America as represented by the Secretary of the Navy, Washington, DC (US)

(*) Notice: Subject to any disclaimer, the term of this patent is extended or adjusted under 35 U.S.C. 154(b) by 187 days.

(21) Appl. No.: 18/338,412

(22) Filed: Jun. 21, 2023

(65) Prior Publication Data

US 2024/0429606 A1 Dec. 26, 2024

(51) Int. Cl.
*H01Q 5/335* (2015.01)

(52) U.S. Cl.
CPC .................................. *H01Q 5/335* (2015.01)

(58) Field of Classification Search
CPC ....................................................... H01Q 5/335
See application file for complete search history.

(56) References Cited

U.S. PATENT DOCUMENTS

| 9,112,258 B1 | 8/2015 | Church et al. |
| 9,806,420 B2 | 10/2017 | Church et al. |
| 10,283,851 B2 | 5/2019 | Church et al. |

FOREIGN PATENT DOCUMENTS

| CN | 101569098 A | * 10/2009 | ............... H03H 7/38 |
| CN | 205811992 U | * 12/2016 | |

* cited by examiner

*Primary Examiner* — Henry Luong
(74) *Attorney, Agent, or Firm* — Naval Information Warfare Center Pacific; Kyle Eppele

(57) ABSTRACT

A method for active circuit antenna optimization includes recording a capacitance value at each frequency of a frequency range using one or more tuning capacitors, thereby generating a capacitor value frequency range. The method further includes creating one or more non-linear circuit designs in an RF circuit simulator. The one or more non-linear circuit designs match the capacitance value at each frequency of the frequency range recorded from the one or more tuning capacitors. The method then includes creating one or more non-linear circuits from the non-linear circuit design. Each tuning capacitor has a corresponding non-linear circuit where all the one or more non-linear circuits match the capacitor value frequency range of the one or more tuning capacitors.

18 Claims, 6 Drawing Sheets

ACTIVE CIRCUIT ANTENNA OPTIMIZATION

STATEMENT REGARDING FEDERALLY SPONSORED RESEARCH OR DEVELOPMENT

The invention described herein may be manufactured and used by or for the government of the United States of America for governmental purposes without the payment of any royalties thereon or therefor. Licensing and technical inquiries may be directed to the Office of Research and Technical Applications, Naval Information Warfare Center Pacific, Code 72120, San Diego, CA, 92152; (619) 553-5118; NIWC_Pacific_T2@us.navy.mil. Reference Navy Case Number 210921.

BACKGROUND

Currently, a 50 Ohm system is the standard for RF antenna systems, which includes test equipment, cables, probes, calibration techniques, and antennas. The intrinsic impedance of an electromagnetic wave in air is about 377 Ohms. Matching 50 Ohm system to a 377 Ohm antenna is more challenging than previous standards, which has caused antenna design to become more challenging as a result. In addition, tuning capacitors used in electrically small antennas are typically not 50 Ohm characteristic impedance and commonly have dynamic ranges that vary depending on the equipment being used to test the tuning capacitors and the antenna design. In ultra-high frequency or very high frequency antennas, adding tuning capacitors generally improves a single frequency in an effective bandwidth of 10 MHz to 15 MHz.

DESCRIPTION OF THE DRAWINGS

Features and advantages of examples of the present disclosure will be apparent by reference to the following detailed description and drawings, in which like reference numerals correspond to similar, but in some instances, not identical, components. Reference numerals or features having a previously described function may or may not be described in connection with other drawings in which they appear.

DETAILED DESCRIPTION

Electromagnetic simulators are traditionally used to optimize antenna performance. However, electromagnetic simulators are limited to simulating only passive components for circuits. In order to simulate a complex active circuit that varies capacitance across a wide frequency range, a non-linear active circuit is required, as well as a circuit simulator that can support non-linear circuit response. There is no simulation tool at present that can simulate both the electromagnetic response of an antenna and the RF active circuit interaction at the same time. Therefore, creating an antenna with capacitor capable of changing the capacitance value as the frequency changes requires educated guessing rather than any predictable determination method.

The method herein can simulate an active circuit by performing many simulations with different tuning capacitors using the electromagnetic simulator at frequencies across a frequency band of interest. The capacitance of each tuning capacitor is then replicated in a simulation with non-linear circuits using a RF circuit simulator. Once the non-linear circuits have the same capacitance of the tuning capacitors, they are produced and the tuning capacitors are replaced by the non-linear active circuits, thereby optimize antenna performance to create a broadband antenna response. This unique methodology can be used to simulate both the electromagnetic response of an antenna and then optimize the active circuit interaction in a RF circuit simulation tool.

A method for active circuit antenna optimization includes recording a capacitance value at each frequency of a frequency range for one or more tuning capacitors, thereby generating a capacitor value frequency range. The method further includes creating one or more non-linear circuit designs in an RF circuit simulator. The one or more non-linear circuit designs match the capacitance value at each frequency of the frequency range for the one or more tuning capacitors. The method then includes creating one or more non-linear circuits from the non-linear circuit design. Each tuning capacitor has a corresponding non-linear circuit where all the one or more non-linear circuits match the capacitor value frequency range of the one or more tuning capacitors.

Figure 1:
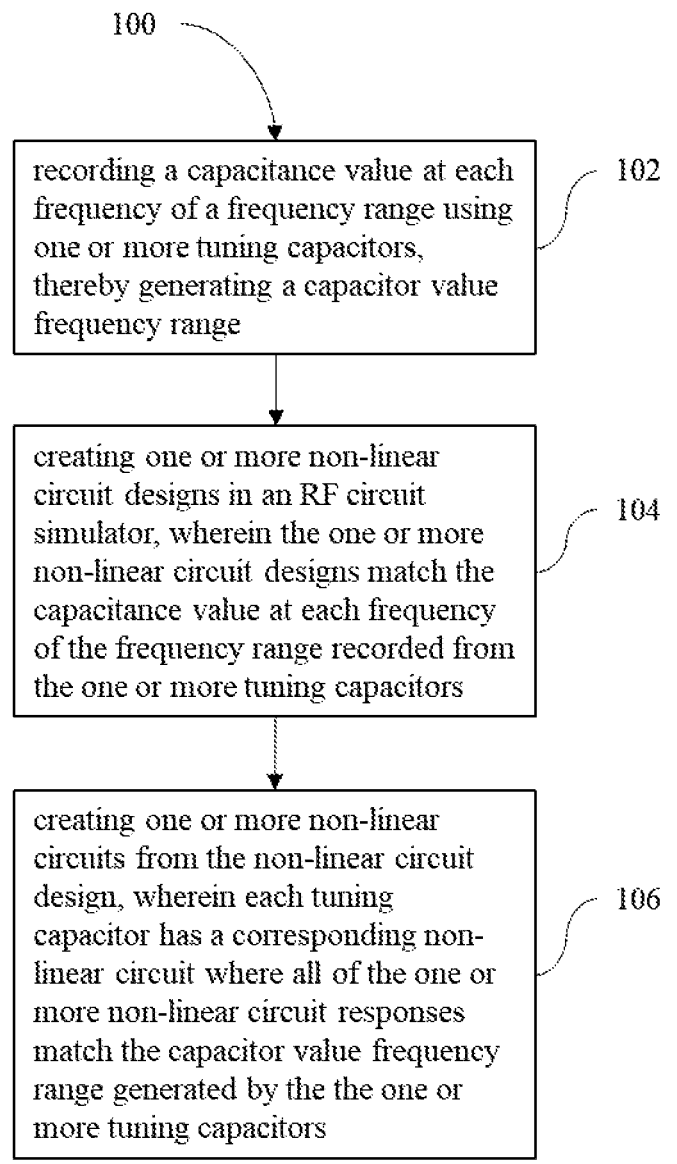
FIG. 1 is a diagram of an example of a method for active circuit antenna optimization described herein.

Referring now to FIG. 1, 102 a capacitance value is recorded at each frequency of a frequency range using one or more tuning capacitors. The recorded capacitance values generate a capacitor value frequency range from the one or more tuning capacitors tested. The one or more tuning capacitors themselves are measured and used to record the capacitance value at each frequency. Any frequency range may be used that is the same frequency range as the antenna being designed. In an example, the frequency range supports a broadband frequency ranging from $F_1$ to $F_2$. The frequency range encompasses all tuning capacitors, therefore each tuning capacitor is tested and recorded at each frequency of a sub-frequency within the frequency range. For example, if the frequency range was 250 MHz to 500 MHz and five tuning capacitors are used, the first tuning capacitor would be tested and recorded at 250 MHz to 300 MHz, the second tuning capacitor would be recorded at 300 MHz to 350 MHz, and so on. In one example, the capacitance value of each tuning capacitor is recorded about 10 MHz apart. Any type of tuning capacitor may be used as the one or more tuning capacitors. Some examples include ceramic capacitors, polyester capacitors, film capacitors, silver mica capacitor, and combinations thereof. There is no limit on the number of tuning capacitors that may be used. The number of tuning capacitors used depends on the type of antenna and the antenna application. Any amount of tuning capacitors may be used as long as the number of non-linear circuits needed to replicate those tuning capacitors fit the physical design of an antenna.

Figure 2:
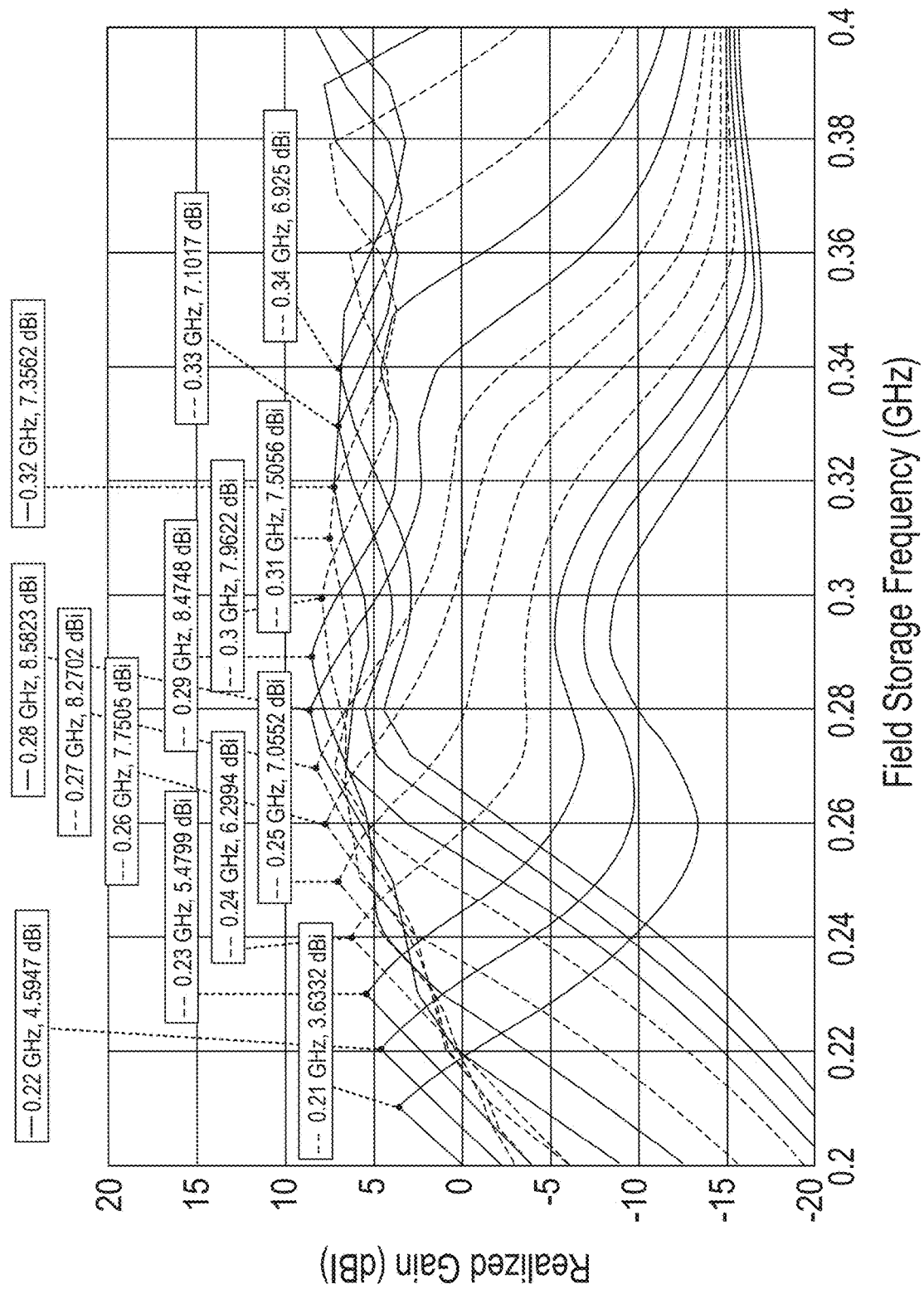
FIG. 2 is an example of an electromagnetic simulation response of a dual-band antenna with optimized capacitor values that shows a plot of the field storage frequency (X-axis) vs. the realized gain (Y-axis)
Figure 3:
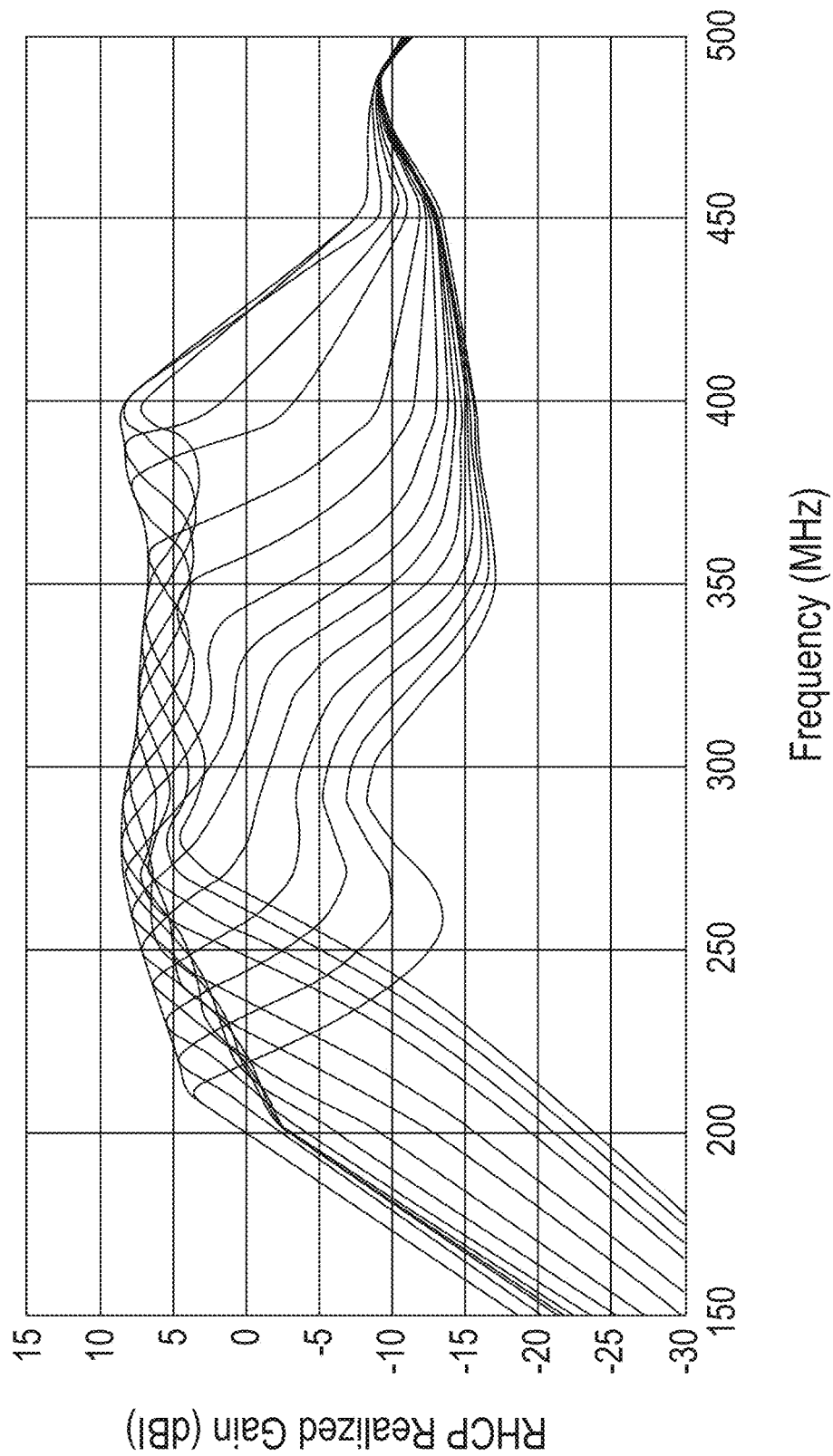
FIG. 3 is an example of an electromagnetic simulation response of a dual-band antenna with optimized capacitor values using an active circuit that shows a plot of the field storage frequency (X-axis) vs. the realized gain (Y-axis)
Figure 4:
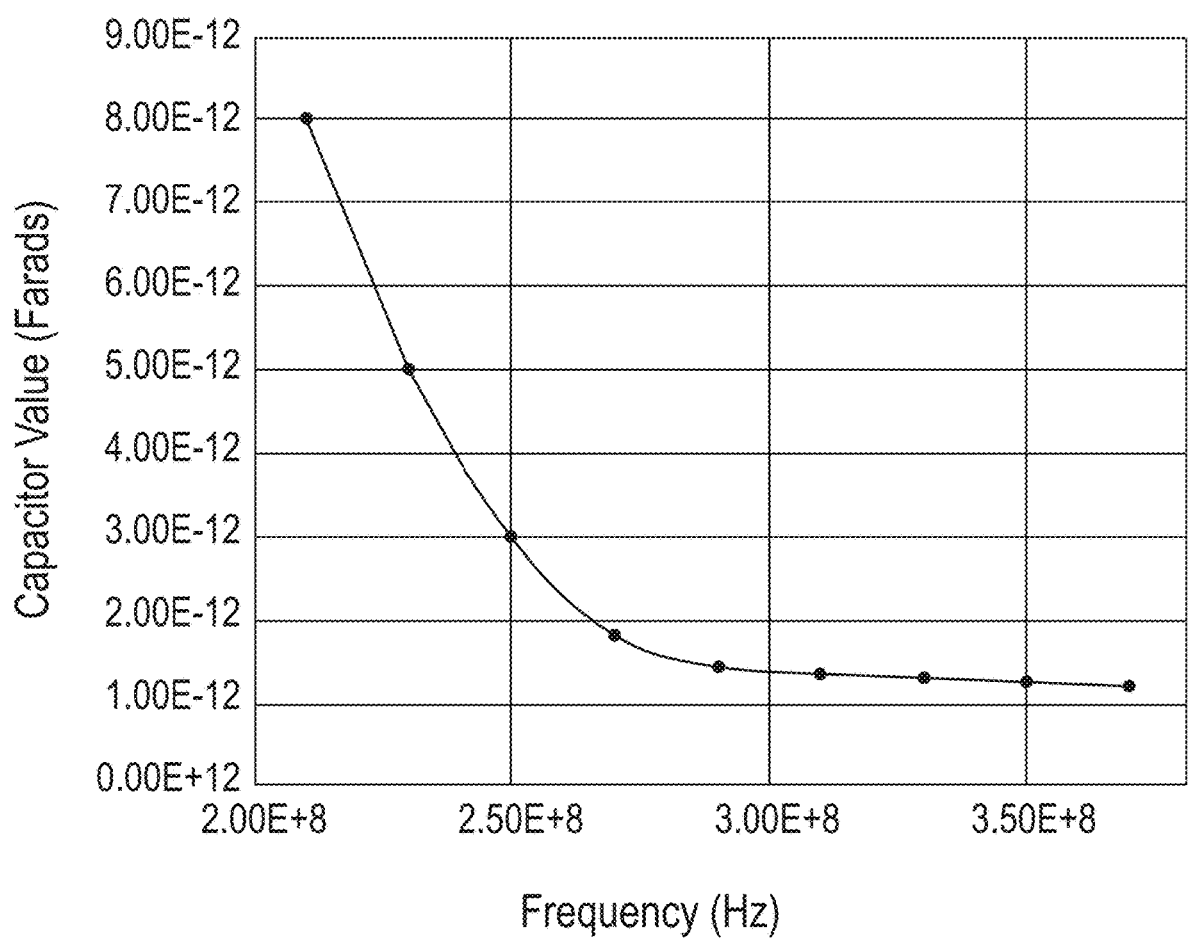
FIG. 4 is an example of the optimized capacitor values from the electromagnetic simulation response of a dual-band antenna that shows the frequency (X-axis) vs. the capacitor value (Y-axis)

FIG. 2 shows an example of the capacitor value range created by recording the capacitance values at each frequency of a frequency range in 102. The capacitor value range is visualized by a plot of the field storage energy (X-axis) vs. the realized gain (Y-axis). Each line on the graph is an example of one tuning capacitor that can be tested and recorded in 102. In the example in FIG. 2, there are fourteen tuning capacitors. Each tuning capacitor has an optimized frequency shown by the individual peaks for each tuning capacitor across the frequency range. The combined optimized peaks of the tuning capacitors can then be used to create an active circuit, as visualized in the FIG. 3 plot of the frequency (X-axis) vs. the realized gain (Y-axis). FIG. 3 shows an example of the individual tuning capacitors and the result of an active circuit that would have the same capacitance at each peak of the individual tuning capacitors for each of the peak frequencies. In FIG. 4, an example of the actual capacitor response across the frequency range that is being tested is plotted and used as a reference to design the active circuit that may be used in an antenna.

Figure 5:
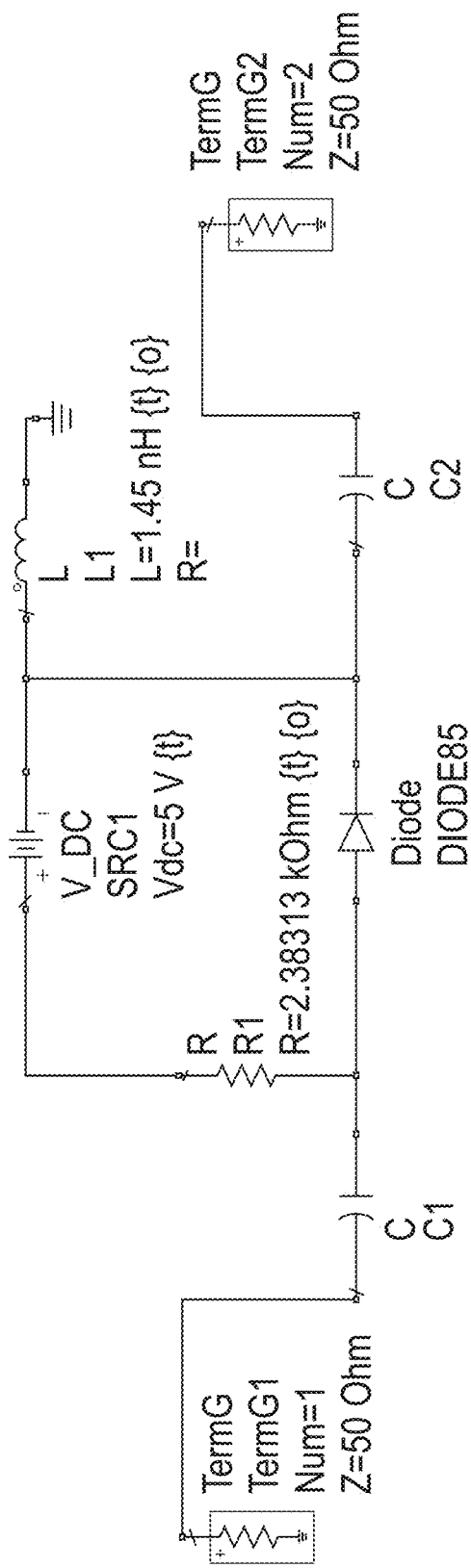
FIG. 5 is a an example of the non-linear circuit design using a diode.
Figure 6:
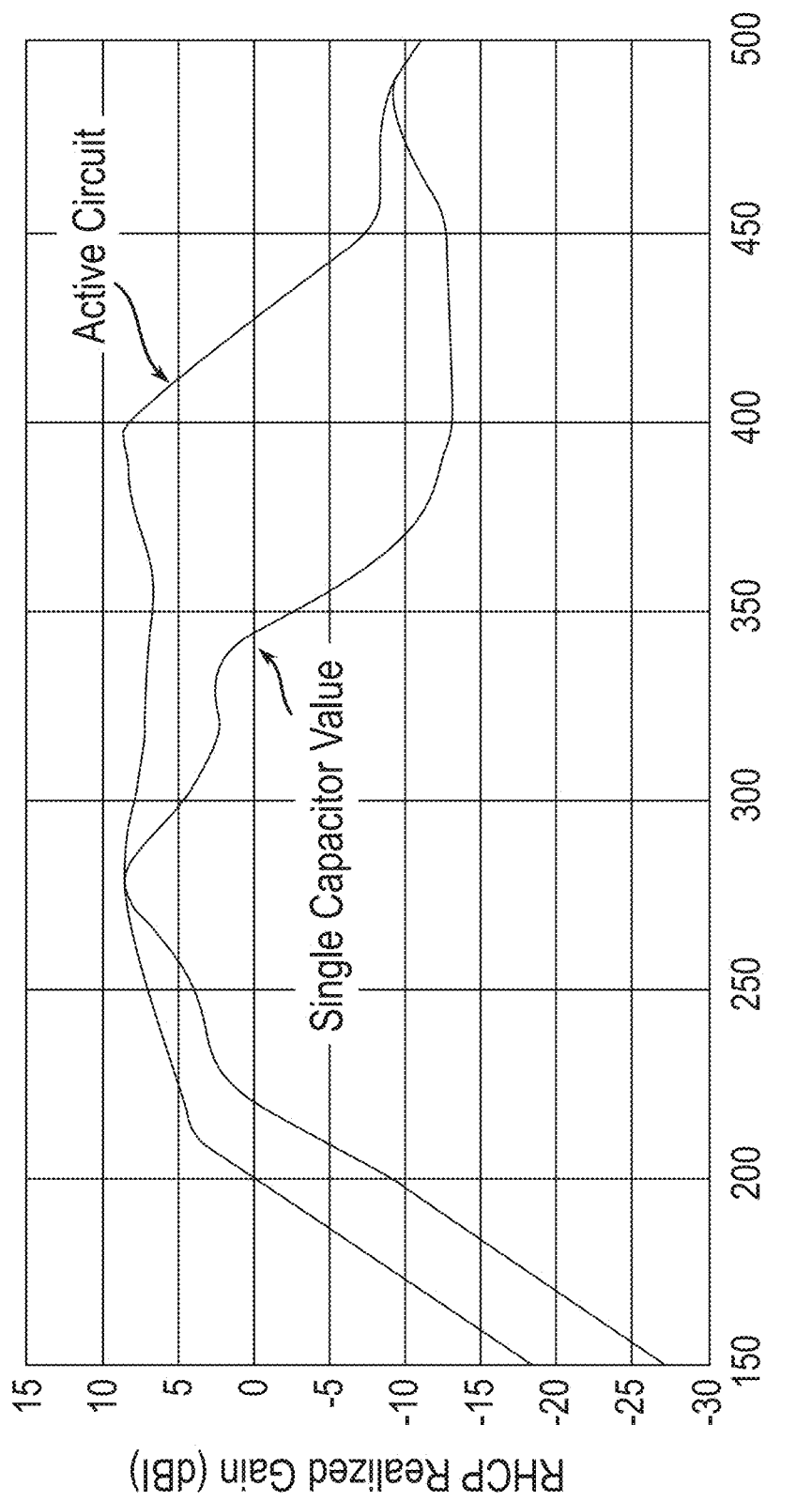
FIG. 6 is an example of the optimized active circuit antenna gain compared to the antenna gain using a single capacitor value at each frequency of the simulated response.

Referring back to FIG. 1, one or more non-linear circuit designs in an RF circuit simulator are created 104. The one or more non-linear circuit designs match the capacitance value at each frequency of the frequency range recorded from the one or more tuning capacitors. In an example, the non-linear circuit is designed using a RF circuit simulator, such as an electromagnetic simulator. The electromagnetic simulator is used to create a non-linear capacitive match where the capacitance value changes with frequency. Any electromagnetic simulator may be used. Some examples of electromagnetic simulator include EMPro, Ansys HFSS, CST Studio Suite®, SEMCAD X Matterhorn, Altair Feko, and IE3D. In one example, matching the capacitance value across frequency requires the same non-linear capacitive response of non-linear circuits as each of the tuning capacitors. To match the capacitive response of the one or more non-linear circuits and the one or more tuning capacitors, there may be the same or a different number of non-linear circuits used as the number of one or more tuning capacitors. An example of the non-linear circuit design is shown in FIG. 5. In the example in FIG. 5, the non-linear circuit is a diode. The capacitive curve in FIG. 5 is set by the current running through the diode. The current is controlled by the voltage and resistor selection in the non-linear circuit.

Referring back to FIG. 1, one or more non-linear circuits are created from the non-linear circuit design 106. Each tuning capacitor that is tested has a corresponding non-linear circuit where all of the one or more non-linear circuit responses match the capacitor value frequency range generated by the one or more tuning capacitors. Any type of non-linear circuit may be used depending on the antenna application. Some examples include diodes, bipolar junction transistors, field effect transistors, dual gate field effect transistors, and combinations thereof. The number of non-linear circuits may be the same or different from (i.e., more or less) than the number of tuning capacitors used in 102. There is no limit on the number of non-linear circuits that may be used. The number and placement of the non-linear circuits used in an antenna is dependent on the function of the antenna. Each antenna is unique in behavior, therefore, the placement and number of non-linear circuits varies with each antenna. Once the non-linear circuits are created, the non-linear circuits may be used as a component in an electrically small antenna. Adding the non-linear circuits to an electrically small antenna creates a broadband electrically small antenna.

A system for active circuit antenna optimization is also described herein. The system includes one or more tuning capacitors, one or more non-linear circuit designs, and one or more non-linear circuits. A capacitor value frequency range is generated for each tuning capacitor by recording a capacitance value at each frequency of a frequency range using one or more tuning capacitors. The one or more non-linear circuit designs are created in an RF circuit simulator and match the capacitance value at each frequency of the frequency range recorded from the one or more tuning capacitors. The one or more non-linear circuits are created from the one or more non-linear circuit designs. Each tuning capacitor has a corresponding non-linear circuit where all of the one or more non-linear circuit responses match the capacitor value frequency range of the one or more tuning capacitors. The one or more tuning capacitors, one or more non-linear circuit designs, and one or more non-linear circuits are the same one or more tuning capacitors, one or more non-linear circuit designs, and one or more non-linear circuits are previously disclosed herein.

As used herein, the term "about" is used to provide flexibility to a numerical range endpoint by providing that a given value may be "a little above" or "a little below" the endpoint. The degree of flexibility of this term can be dictated by the particular variable and would be within the knowledge of those skilled in the art to determine based on experience and the associated description herein.

As used herein, a plurality of items, structural elements, compositional elements, and/or materials may be presented in a common list for convenience. However, these lists should be construed as though each member of the list is individually identified as a separate and unique member. Thus, no individual member of a list should be construed as a de facto equivalent of any other member of the same list merely based on their presentation in a common group without indications to the contrary.

Unless otherwise stated, any feature described herein can be combined with any aspect or any other feature described herein.

Reference throughout the specification to "one example", "another example", "an example", means that a particular element (e.g., feature, structure, and/or characteristic) described in connection with the example is included in at least one example described herein, and may or may not be present in other examples. In addition, the described elements for any example may be combined in any suitable manner in the various examples unless the context clearly dictates otherwise.

The ranges provided herein include the stated range and any value or sub-range within the stated range. For example, a range from about 0.1 to about 20 should be interpreted to include not only the explicitly recited limits of from about 0.1 to about 20, but also to include individual values, such as 3, 7, 13.5, etc., and sub-ranges, such as from about 5 to about 15, etc.

In describing and claiming the examples disclosed herein, the singular forms "a", "an", and "the" include plural referents unless the context clearly dictates otherwise.

What is claimed is:

1. A method for active circuit antenna optimization, comprising:
   recording a capacitance value at each frequency of a frequency range using one or more tuning capacitors, thereby generating a capacitor value frequency range;

creating one or more non-linear circuit designs in an RF circuit simulator, wherein the one or more non-linear circuit designs match the capacitance value at each frequency of the frequency range recorded from the one or more tuning capacitors; and creating one or more non-linear circuits from the non-linear circuit design, wherein each tuning capacitor has a corresponding non-linear circuit where all of the one or more non-linear circuit responses match the capacitor value frequency range of the one or more tuning capacitors.

2. The method of claim 1, further including using the one or more non-linear circuits in an electrically small antenna.

3. The method of claim 2, wherein the electrically small antenna is a broadband antenna.

4. The method of claim 1, wherein the one or more non-linear circuits are diodes, bipolar junction transistors, field effect transistors, Dual Gate field effect transistors, and combinations thereof.

5. The method of claim 1, wherein the frequency range supports a broadband frequency ranging from $F_1$ to $F_2$.

6. The method of claim 1, wherein the capacitance value of each tuning capacitor is recorded about 10 MHz apart.

7. The method of claim 1, wherein a number of the one or more non-linear circuits matches a number of the one or more tuning capacitors.

8. The method of claim 1, wherein a number of the one or more non-linear circuits is different from a number of the one or more tuning capacitors.

9. The method of claim 1, wherein the one or more tuning capacitors are selected from a group consisting of ceramic capacitors, polyester capacitors, film capacitors, silver mica capacitor, and combinations thereof.

10. A system for active circuit antenna optimization, comprising:

one or more tuning capacitors, wherein a capacitor value frequency range is generated by recording a capacitance value at each frequency of a frequency range using one or more tuning capacitors;

one or more non-linear circuit designs, wherein the one or more non-linear circuit designs are created in an RF simulator and match the capacitance value at each frequency of the frequency range recorded from the one or more tuning capacitors; and one or more non-linear circuits, wherein the one or more non-linear circuits are created from the one or more non-linear circuit designs and each tuning capacitor has a corresponding non-linear circuit where all of the one or more non-linear circuit responses match the capacitor value frequency range of the one or more tuning capacitors.

11. The system of claim 10, further including an electrically small antenna, wherein the one or more non-linear circuits are used in the electrically small antenna.

12. The system of claim 11, wherein the electrically small antenna is a broadband antenna.

13. The system of claim 10, wherein the one or more non-linear circuits are diodes, bipolar junction transistors, field effect transistors, Dual Gate field effect transistors, and combinations thereof.

14. The system of claim 10, wherein the frequency range supports a broadband frequency ranging from $F_1$ to $F_2$.

15. The system of claim 10, wherein the capacitance value of each tuning capacitor is recorded about 10 MHz apart.

16. The system of claim 10, wherein a number of the one or more non-linear circuits matches a number of the one or more tuning capacitors.

17. The system of claim 10, wherein a number of the one or more non-linear circuits is different than a number of the one or more tuning capacitors.

18. The system of claim 10, wherein the one or more tuning capacitors are selected from a group consisting of ceramic capacitors, polyester capacitors, film capacitors, silver mica capacitor, and combinations thereof.

\* \* \* \* \*